United States Patent [19]

Scheinbeim et al.

[11] Patent Number: 5,204,013

[45] Date of Patent: Apr. 20, 1993

[54] POLARIZED PRODUCTS

[75] Inventors: Jerry I. Scheinbeim, Somerset; Brian A. Newman, Highland Park, both of N.J.

[73] Assignee: Rutgers, The State Unversity of New Jersey, New Brunswick, N.J.

[21] Appl. No.: 360,788

[22] Filed: Jun. 2, 1989

Related U.S. Application Data

[63] Continuation-in-part of Ser. No. 62,014, Jun. 25, 1987, Pat. No. 4,863,648, which is a continuation-in-part of Ser. No. 881,828, Jul. 3, 1986, Pat. No. 4,830,795.

[51] Int. Cl.$^5$ ............................................. C04B 35/00
[52] U.S. Cl. ..................... 252/62.9; 264/22; 264/24
[58] Field of Search .................... 252/62.9 R

[56] References Cited

U.S. PATENT DOCUMENTS

| | | | |
|---|---|---|---|
| 4,239,608 | 12/1980 | Pantelis | 252/62.9 R |
| 4,521,322 | 6/1985 | Broussoux et al. | 252/62.9 R |
| 4,668,449 | 5/1987 | Soni et al. | 252/62.9 R |
| 4,751,014 | 6/1988 | Ozeki et al. | 252/62.9 R |

*Primary Examiner*—Ellen McAvoy
*Attorney, Agent, or Firm*—Leroy G. Sinn

[57] ABSTRACT

This invention relates to a polarized material which is free or substantially free of mechanically-induced orientation and has polarization which is essentially stable up to the crystal melting temperature range of the polar crystals or to the softening temperature range or the glass transition temperature range of the polarized material if it is non-crystalline. A preferred polarized material provided is poly(vinylidene fluoride).

28 Claims, 4 Drawing Sheets

POLING SET-UP

FIG. 1 POLING SET-UP

POLING SEQUENCE

Corona Solution Poling Set-up

POLARIZED PRODUCTS

This invention was made with Government support under the Office of Naval Research, Grant No. N00014-80C-0795, and the Government has certain rights in the invention.

CROSS-REFERENCE TO RELATED APPLICATION

This application is a continuation-in-part of U.S. application Ser. No. 07/062,014, filed Jun. 25, 1987, issued as U.S. Pat. No. 4,863,648; which is a continuation-in-part of U.S. application Ser. No. 06/881,828, filed Jul. 3, 1986, issued as U.S. Pat. No. 4,830,795.

TECHNICAL FIELD

This invention relates to a process for making polarized material with a net polarization. It provides an improved and more efficient process for making such materials and is particularly useful for making polymeric materials or material products with piezoelectric and pyroelectric properties. Also, by this invention is provided a polarized material which is essentially stable up to its crystal melting point or its softening point, if the polarized material is non-crystalline. The polarized material is substantially free of mechanically-induced orientation and has mechanical and electromechanical properties isotropic in a plane perpendicular to the poling field direction.

BACKGROUND ART

Certain materials such as various polymeric materials are capable of being polarized when subjected to mechanical or electrical stresses. In the past, it has been found that a polymeric material such as poly(vinylidene fluoride) can be polarized by stretching a sheet at a temperature of about 70° C. at least three times its length, and subjecting the stretched sheet to a DC field of at least 1 MV/cm. Poly(vinylidene fluoride) has been a preferred material for polarization, since it has been found to have a high capability of polarization response, thereby providing high piezoelectric or pyroelectric properties or highly desired optical properties. Subjecting such a stretched film, for example, using an appropriate DC field applied in a direction perpendicular to the plane of the stretched film causes an orientation of the molecular dipoles of the materials. In the case of poly(vinylidene fluoride), the fluoro groups have a negative charge and the hydrogen atoms attached to the other carbon of the vinylidene fluoride unit of the polymer have a positive charge. Vinylidene fluoride units in a poly(vinylidene fluoride) can exist in at least two different crystalline forms. In one form, the vinylidene fluoride units exist in a planar zigzag polar form or transform (beta form or Form 1). In another form, the form is nonpolar and nonplanar; it is a T-G-T-G' form (alpha form or Form 2) wherein T denotes trans configuration and G and G' denote the two types of gauche forms. In the past, the desired increase in Form 1 has been realized by subjecting poly(vinylidene fluoride) films (PVF$_2$ films) to stretching and subsequently subjecting the stretched to high DC fields over extended periods of time at high temperatures. Such treatment with a DC field is referred to as "poling". It is desired to have a high content of Form 1 in order to have the highest amount of desired polarization properties, for example, piezoelectric and pyroelectric properties. The polarized material is cooled after poling for purposes of retaining the polarization.

Such polarized materials are used, for example, in making transducers, which utilize the piezoelectric or pyroelectric or other polarization properties of such polarized materials.

Various other polarizable polymers having various groups such as fluoro, chloro, amide, ester, cyanide, carbonate, nitrile, ether, and the like, such as polyvinylchloride (PVC), polyvinylfluoride (PVF), vinylidene fluoride copolymers, and many other polymer materials have the capability of being polarized as do various non-polymeric materials such as some ceramic materials.

Customary stretching in the film direction causes an unequal (or anisotropic) elastic modules in the stretching or axial direction (X—X$^1$) as compared to the transverse direction (y—y$^1$) This is undesirable. It is desired to provide materials which are free or substantially free of such mechanically induced orientation and which have a polarization which is stable up to the crystal melting point or material softening point, in the case of non-crystalline polarized materials. Such materials are substantially free of said anisotropic mechanical properties. Such polarized materials and processes for producing such materials are highly desired.

SUMMARY OF INVENTION

A process has been found by which highly polarized materials can be produced which are free or substantially free of mechanically-induced orientation and which polarization is essentially stable up to about the crystal melting temperature range (glass transition temperature) of the polarized material or up to about the softening temperature range or glass transition temperature range of the polarized material in the case of non-crystalline polarized material. The process comprises dissolving a material to be polarized in a solvent or solvents for that material. The solvent is selected which is adapted to the polarization of the material and which can be removed to the extent desired by evaporation during the course of the polarization or prior to or subsequent to the polarization. The temperature employed will be one at which polarization effectively occurs, ordinarily at an elevated temperature below which substantial dielectric breakdown occurs. The DC field employed in the polarization will be selected which provides the desired polarization.

Also provided by this invention are polarized products which are free or substantially free of mechanically induced orientation and which are essentially stable up to about the crystal melting point of the material or in the case of non-crystalline material up to about the softening temperature range or glass transition temperature range of the material.

The material presently preferred is poly(vinylidene fluoride) or certain copolymers of vinylidene fluoride.

DETAILED DESCRIPTION OF THE INVENTION AND THE PREFERRED EMBODIMENTS

The process is carried out by first dissolving the material to be polarized in the required amount of a suitable solvent or solvents to form a solution. For example, if poly(vinylidene fluoride) is selected as the material, a suitable solvent such as tricresylphosphate can be used. It has been found that about five parts of a poly(vinylidene fluoride), which is suitable for making a polarized film, is an acceptable amount to dissolve in 95 parts of tricresylphosphate or another polarization solvent for making the solution for polarization. The mixture is heated to about 180°-190° C. to aid dissolution. It has been found that a capacitor grade poly(vinylidene fluoride) as sold by Kureha Kagoku Kogko Kabishiki Kaisha is suitable.

Ordinarily, it is preferred to reduce the solvent content in the solution prior to commencement of polarization. For example, in the case of poly(vinyldene fluoride)/tricresylphosphate solution, the solvent content can be reduced from 95 parts to 50 parts or below such as to 26.5 parts as shown in FIG. 2 or lower providing the poly(vinylidene fluoride) remains in solution.

The solution with the reduced solvent content then is preferably placed in a press under a suitable pressure of 2500 to 3500 psi at an elevated temperature below the degradation temperature of the polymer; for example, it has been found suitable to use a pressure of 3000 psi and a temperature of 185° C. The film then is preferably cooled rapidly as by immersion in an ice bath.

Figure 1:
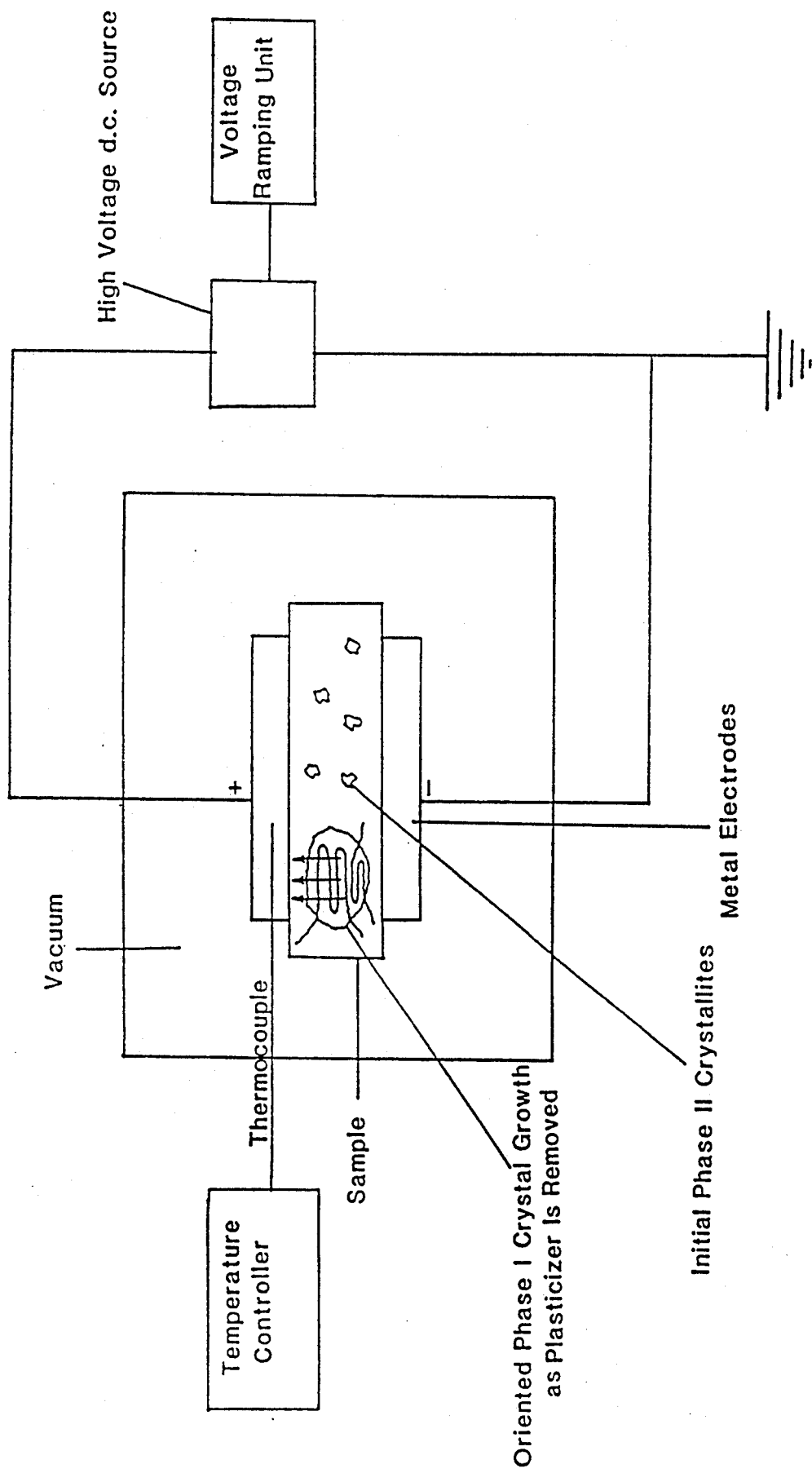
FIG. 1 is a schematic representation of an apparatus used to provide the DC field for the polarization of the material and to provide as desired for removal of solvent by evaporation during poling.

As shown in FIG. 1, the solution of poly(vinylidene fluoride) with the reduced solvent content can be placed into a suitable vacuum oven which is equipped with an appropriate DC source. The poly(vinylidene fluoride) solution is placed between two suitable electrodes. Polished copper plates can be used as the electrodes. The electric field is provided. Temperature is adjusted as desired. A temperature can be used which will provide a high rate of removal of the solvent and a high rate of polarization without substantial dielectric breakdown of the material being polarized. The solvent content can be reduced if desired by evaporation prior to poling and can be further reduced after poling, if desired.

Figure 2:
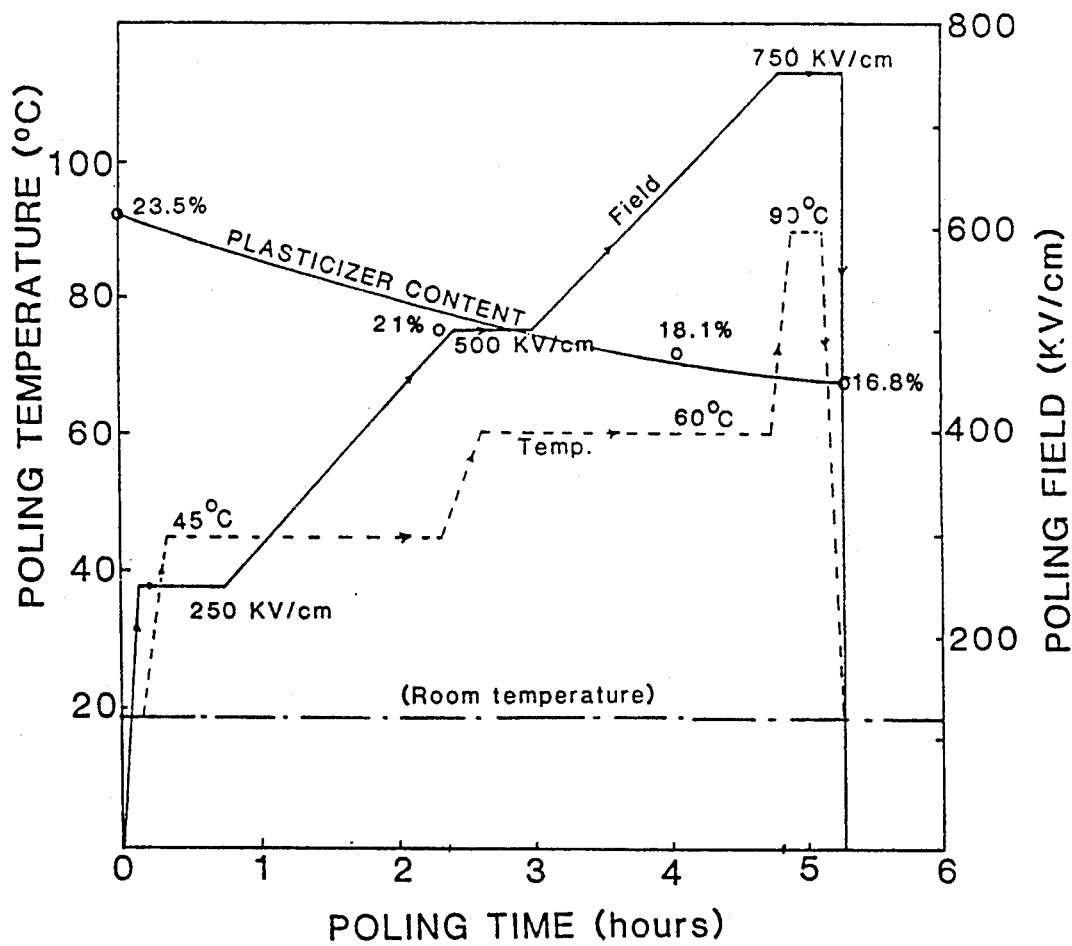
FIG. 2 is a graph showing the DC field, the content of solvent present and the temperature of polarization in illustration of the process in which poly(vinylidene fluoride) is used as the polarized material.

The process can be carried out to provide a desired polarized poly(vinylidene fluoride) film as shown in FIG. 2.

The solvent can be reduced in the polarized material is desired. However, it has been found that retaining a small amount of solvent in the polarized material provides desirable improvement in the dielectric constant. For example, the dielectric constant of the poly(vinylidene fluoride) film can thereby be increased by up to about 400 percent, preferably from about 50 percent to about 300 percent and still retain an essentially stable polarization up to the crystal melting temperature range or to the softening temperature range of glass transition temperature range of the material used in the polarization process, as the case might be.

Figure 3:
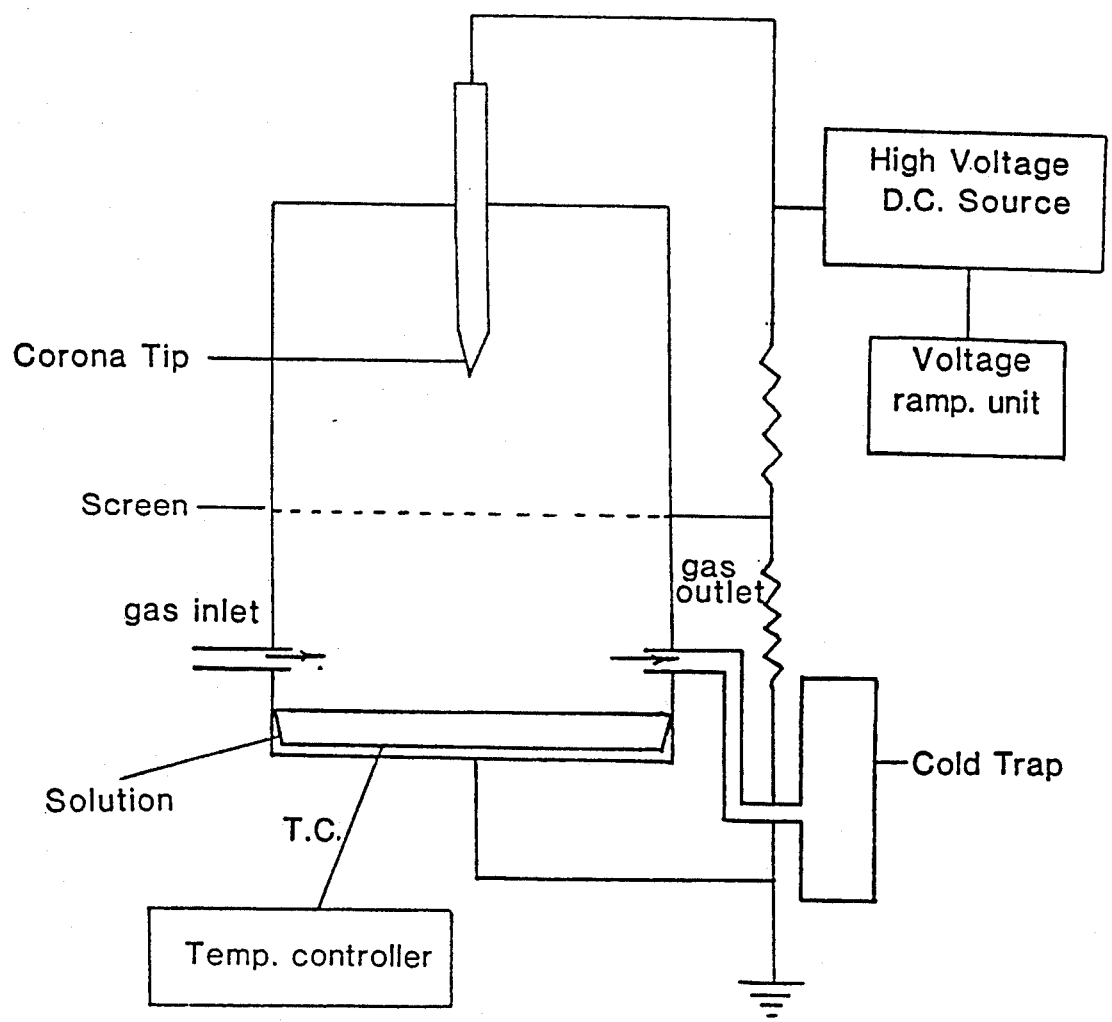
FIG. 3 is a schematic representation of an apparatus for carrying out the invention by which the electric field is provided by corona discharge and the solvent can be removed by passing a solvent over the surface of the solution of the material to reduce solvent content as desired.

The poling can also be carried out using corona discharge to provide the electrical field. As shown in FIG. 3, a conventional corona discharge apparatus can be used. The grid as shown in FIG. 3 is placed above the solution of material to be polarized. As shown in FIG. 3, the solvent content can be reduced during the polarization by passing a flow of a suitable gas over the surface of the film. It has been found that nitrogen ordinarily is a suitable gas for this purpose. The gas with the uptaken solvent can be processsed in a conventional manner to remove or reduce the content of solvent and the gas can be passed in a continuous manner again over the film being polarized. If desired, the solvent content of the solution can be reduced prior to poling and then can be further reduced after poling if desired.

Also, the process can be made continuous by placing the solution film on a moving conveyer in suitable arrangement of corona discharge elements together with an appropriate means of solvent removal, as a passage of a suitable gas over the surface of the material solution, if solvent removal is desired during poling.

The intensity of the electric field used will ordinarily be selected to provide efficient polarization. However, it will be kept below the range at which substantial dielectric breakdown of the material being polarized occurs. In the case of poly(vinylidene fluoride), it has been found that an electrical field of 250 KV/cm is satisfactory to pole a poly(vinylidene fluoride) film solution having a 23.5 percent solvent content, as shown in FIG. 3. Also, it is shown in FIG. 3 that the electrical field could satisfactorily be increased to 500 KV/cm as the solvent content decreased and increased further to 750 KV/cm when the solvent content is reduced to about 16 percent. The initial electrical field could have been reduced below 250 KV/cm such as to 50-200 KV/cm; however, using lower electrical fields than those in a maximum range results in less efficient polarization. Under the conditions of FIG. 3, the further increase of the electrical field beyond 750 KV/cm at 16 percent solvent can result in some dielectric breakdown, for example, in the range of about 800 to about 1000 KV/cm. Care should be exercised to stay below an electrical field of such intensity that dielectric breakdown of the material occurs. The electrical field at which substantial breakdown occurs can be determined by preliminary experimentation.

The temperature at which the polarization process is carried out depends upon the desired rate at which polarization occurs, the material used, the solvent used, the equipment available for polarization, the desired level of solvent wished to be retained in the final polarization material and other factors. As is shown in FIG. 3, a starting poling temperature of 45° C. is used satisfactorily. The temperature is increased to 60° C. and finally the temperature of 90° C. is used when solvent content is reduced to about 16 percent. Obviously, the poling temperature should be maintained lower than the boiling point of the solvent under the conditions used.

Materials which can be used in this invention can vary widely so long as they have a polarization capability. As mentioned above, a preferred material is poly(vinylidene fluoride). Copolymers of vinylidene fluoride are also desirable materials, such as vinylidene fluoride copolymers with vinyl fluoride, trifluoroethylene, tetrafluoroethylene, vinyl chloride, methylmethacrylate, and others. The vinylidene fluoride content can vary in the range of from about 30 percent to about 95 percent based on the total polymer weight. Other polymers which can be used are polyvinylchloride, polymethylacrylate, polymethylmethacrylate, vinylidene cyanide/vinyl acetate copolymers, vinylidene cyanide/vinyl benzoate copolymers, vinylidene cyanide/isobutylene copolymers, vinylidene cyanide/methyl methacrylate copolymers, polyvinylfluoride, polyacrylonitrile, polycarbonate, and nylons such as Nylon-7 and Nylon-11, natural polymers such as cellulose and proteins, synthetic polymers such as derivatives of cellulose, such as esters and ethers, poly ( -methyl-L-glutamate), and the like. Also, polarizable materials which are soluble ceramic materials and capable of forming polar crystals or glasses can be used together with an appropriate polarization solvent for particular soluble ceramic material used.

A variety of suitable solvents can be used depending upon the material used in the polarization, cost and safety consideration, equipment used, and other factors. In the use of poly(vinylidene fluoride) material, tricresylphosphate has been found to be a suitable solvent. It is also suitable for use when many copolymers of vinylidene fluoride are used. Dibutyl phthalate can also be used as the solvent for these vinylidene polymers. In the use of nylon-7 and nylon-11, 2-ethyl-1,3-hexanediol can be used. Other solvents can be used depending upon the polymer material used and other factors and will be suggested to those skilled in the art.

The term solution as used herein has its usual meaning of a mixture of two or more elements or compounds which appear to be homogeneous even to the highest possible magnification of visible light. *The Encyclopedia of Chemistry*, 2nd ed., Ed. George L. Clark, Reinhold Publishing Corporation, New York, N.Y., 1966, page 989.

Figure 4:
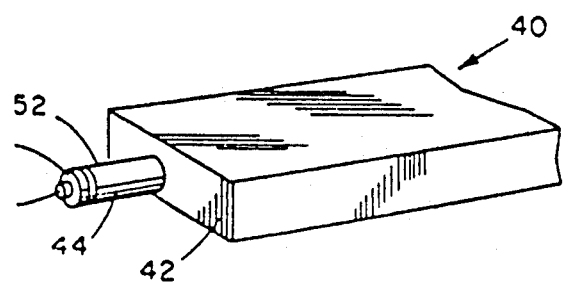
FIG. 4 is a perspective view of a transducer using polarization poly(vinylidene fluoride) film made by the process of this invention as the active piezoelectric material.

Polarized materials provided by this invention can be used in making transducers having standard transducer configurations. FIG. 4 shows a perspective view of a transducer 40 using polarized poly(vinylidene fluoride) film as the active piezoelectric material. Transducer 40 includes a long and flat outer layer 42 and a piezoelectric cable 44 is enveloped in outer layer 42. Piezoelectric cable 44 is provided with a piezoelectric layer or sheet 46 of poly(vinylidene fluoride) rolled on the outer periphery of a center electrode 50 which is made of a thin metallic wire. The outer electrode 52 made of a thin metallic film is formed on the outer periphery of layer 46. In operation, when pressure induced by an acoustic signal is exerted on the outer layer 42, it is transmitted to layer 46 of poly(vinylidene fluoride) and electric potential is generated between electrodes 50 and 52. Conversely, a pressure wave is generated by the transducer when an electrical signal is applied between the two electrodes 50 and 52.

Measurements of piezoelectric strain constant, $d_{31}$, piezoelectric stress constant, $e_{31}$, pyroelectric constant, $p_y$, dielectric constant and dynamic mechanical modulus were determined in conventional manner (measured at 3 Hz). The percentages of crystallinity are determined by X-ray diffractometer scans.

Certain additives or dopants can be incorporated into the polarized materials of this invention to provide certain additional properties so long as their presence does not substantially interfere with the desired properties of the polarized materials provided by this invention.

EXAMPLE 1

Five parts of Kureha capacitor grade poly(vinylidene fluoride) ($PVF_2$) film are dissolved in 95 parts of tricresylphosphate at 185° C. The solution is transferred to a tray and placed into a vacuum oven. The oven is maintained at a vacuum of about $10^{-3}$ torr and at a temperature within the range of 150° C. -200° C. until a $PVF_2$ solution is obtained having about 70 percent by weight of $PVF_2$ and 30 percent by weight of tricresylphosphate. The $PVF_2$ solution is transferred as a film to a press, subjected to a pressure of 3000 psi and heated to 185° C. The film is then rapidly cooled by immersion into an ice bath. The $PVF_2$ solution film now comprises 76.5 percent by weight of $PVF_2$ and 23.5 percent by weight of tricresylphosphate. This film having a thickness of about 1 mil is transferred to a poling apparatus of the type depicted in FIG. 1 between two polished copper plates, is connected to a high voltage DC supply, and then is placed under high vacuum ($\sim 10^{-6}$ torr). The $PVF_2$ solution film is poled as shown in FIG. 2 at 250 KV/cm at 45° C. for about 45 minutes, at which point the field is linearly increased to 500 KV/cm at poling time of about 2.3 hours, while maintaining the temperature at 45° C. The temperature is then increased to 60° C. At poling time of 3 hours, the field is linearly increased to 750 KV/cm at poling time of 4.8 hours, at which time the temperature is increased to 90° C. Poling is continued at 750 KV/cm field for about 30 minutes at which time the temperature is permitted to return to room temperature. When room temperature is reached, the field is reduced to zero. Retained solvent content is about 17 percent.

The polarized material shows the following properties:

| | |
|---|---|
| $d_{31}$ | 13 pC/N |
| $d_{33}$ | 32 pC/N |
| $e_{31}$ | 9.5 mc/m2 |
| $P_y$ | 22.5 $uC/m^2K$ |
| dielectric constant | 31 |
| dynamic mechanical modules | $0.6 \times 10^{10}$ dynes/$cm^2$ (at 3 Hz) |
| dp | 5 pC/N |

EXAMPLE 2

Five parts of Kynar copolymer $VF_2VF_3$ (80% $VF_2$) film produced by Pennwalt Corporation are dissolved in 95 parts of tricresylphosphate at 240° C. The solution is transferred to a tray and placed into a vacuum oven. The oven is maintained at a vacuum of about $10^{-3}$ torr and at a temperature within the range of 100° C. -120° C. until a copolymer solution is obtained having about 70 percent by weight of copolymer and 30 percent by weight of tricresylphosphate. The copolymer solution is transferred as a film to a press, subjected to a pressure of 3000 psi and heated to 125° C. The film is then rapidly cooled by immersion into an ice bath. This film having a thickness of about 1 mil is transferred to a poling apparatus of the type depicted in FIG. 1 between two polished copper plates, is connected to a high voltage DC supply, and then is placed under high vacuum ($\sim 10^{-6}$ torr). The copolymer solution film is poled generally in a manner as shown in FIG. 2 at 250 KV/cm at 45° C. for about 45 minutes, at which point the field is linearly increased to 600 KV/cm at poling time of about 4 hours while maintaining the temperature at 45°

C. The temperature is then increased to 60° C. Poling is continued at 600 KV/cm field for about 15 minutes at which time the temperature is permitted to return to room temperature. When room temperature is reached, the field is reduced to zero.

The polarized material shows the following properties:

| | |
|---|---|
| $d_{31}$ | 9.66 pC/N |
| $e_{31}$ | 2.3 mc/m$^2$ |
| modulus | $0.18 \times 10^{10}$ dynes/cm$^2$ |
| $P_y$ | uC/m$^2$K |
| dielectric constant | 12.2 |
| $d_{33}$ | 16.5 pC/N |
| dp | 2.7 pC/N |

EXAMPLE 3

One part by weight of Nylon 11 is dissolved in four parts of 2-ethyl-hexane 1,3 diol at 150° C. The solution is transferred to a tray and placed in a vacuum oven. The oven is maintained at a vacuum of about $10^{-3}$ torr and at a temperature of 50° C. until Nylon 11 solution is obtained having about 50% by weight of Nylon 11. The Nylon 11 solution is transferred as a film to a press, subjected to a pressure of 1000 psi and heated to 200° C. The film is then rapidly cooled by immersion into an ice bath. The Nylon 11 solution film now comprises 70% by weight of Nylon 11 and 30% by weight of 2-ethyl-hexane 1,3 diol. This film having a thickness of about 1 mil is transferred to a poling apparatus of the type depicted in FIG. 1 between two polished copper plates, is connected to a high voltage DC supply, and then is placed under high vacuum ($\sim 10^{-6}$ torr). The Nylon 11 solution film is poled generally in a manner as shown in FIG. 2. The field is increased linearly from zero to 350 KV/cm in ten minutes, while maintaining the temperature at 22° C. Poling at this field strength is continued for a further ten minutes at which time the field is reduced to zero.

EXAMPLE 4

One part by weight of Nylon 7 is dissolved in four parts of 2-ethyl-hexane 1,3 diol at 170° C. The solution is transferred to a tray and placed into a vacuum oven. The oven is maintained at a vacuum of about $10^{-3}$ torr and at a temperature of 50° C. until Nylon 7 solution is obtained having about 50% by weight of Nylon 7. The Nylon 7 solution is transferred as a film to a press, subjected to a pressure of 1000 psi and heated to 220° C. The film is then rapidly cooled by immersion into an ice bath. The Nylon 7 solution film now comprises 73% by weight of Nylon 7 and 27% by weight of 2-ethyl-hexane 1,3 diol. This film having a thickness of about 1 mil is transferred to a poling apparatus of the type depicted in FIG. 1 between two polished copper plates, is connected to a high voltage DC supply, and then is placed under high vacuum ($\sim 10^{31\ 6}$ torr). The Nylon 7 solution film is poled generally in a manner as shown in FIG. 2. The field is increased linearly from zero to 350 KV/cm in ten minutes, while maintaining the temperature at 22° C. Poling at this field strength is continued for a further ten minutes at which time the field is reduced to zero.

EXAMPLE 5

Five parts of Kureha capacitor grade poly(vinylidene fluoride) (PVF$_2$) film are dissolved in 95 parts of tricresylphosphate at 185° C. The solution is transferred to a tray and placed into a vacuum oven. The oven is maintained at a vacuum of about $10^{-3}$ torr and at a temperature within the range of 150° C. -200° C. until a PVF$_2$ solution is obtained having about 70 percent by weight of PVF$_2$ and 30 percent by weight of tricresylphosphate. The PVF$_2$ solution is transferred as a film to a press, subjected to a pressure of 3000 psi and heated to 185° C. The film is then rapidly cooled by immersion into an ice bath. The cooled film has some crystallinity, approximately 12-13percent The PVF$_2$ and 23.5 percent by weight of tricresylphosphate. This film having a thickness of about 1 mil is transferred to a poling apparatus of the type depicted in FIG. 1 between two polished copper plates, is connected to a high voltage DC supply. The PVF$_2$ solution film is heated to 160° C. The solution is poled as shown in FIG. 2 heated for about 60 minutes. During the poling, the temperature is decreased linearly at 2° C./min to 30° C. and the poling field is increased linearly from 25 KV/cm to 1000 KV/cm. When room temperature is reached, the field is reduced to zero. Retained solvent content is about 23.5 percent. The resulting product is polarized.

EXAMPLE 6

The process of Example 5 is repeated except that the solution of PVF$_2$ at 160° C. is quenched below the Tg temperature to inhibit crystallization. The quenched solution is poled using 1000 KV/cm while the temperature is increased linearly 1° C./min to room temperature at which point the poling field is reduced to zero. The retained solvent content is about 23.5 percent. The resulting product is polarized.

The polarized product produced can be further processed by applying a poling field under vacuum following the general procedure of Example 1.

EXAMPLE 7

Other materials such as other polymers and soluble ceramic materials described above can be used to provide polarized materials of this invention by following generally the procedures of Example 1 or 5 with any modifications within the skill of the art.

EXAMPLE 8

The procedure of Example 4 is repeated using instead of Nylon 7, a blend comprising 50 percent by weight of Nylon 7 and 50 percent by weight of Nylon 11. The product obtained is polarized.

What is claimed is:

1. A polarized material which is characterized as follows
    1) is free or substantially free of mechanically-induced molecular orientation;
    2) has polarization which is essentially stable to about the crystal melting temperature range of the polar crystals of the material or to about the softening temperature range or glass transition temperature range of the material if it is non-crystalline; and
    3) has mechanical and electromechanical properties isotropic or substantially isotropic in a plane perpendicular to the poling field direction;

said polarized material being a composition comprising essentially all or all of said polarized material.

2. A polarized material of claim 1 in which there is distributed therein a plasticizer amount of a polarization solvent which can be removed without substantial loss in said characteristics of the polarized material.

3. A polarized material of claim 1 which comprises a dielectric constant improving solvent in an amount sufficient to afford a substantially higher dielectric constant as compared with the polarized material free of said solvent.

4. A polarized material of claim 3 wherein the dielectric constant is increased by at least 50 percent.

5. A polarized material of claim 1 wherein the material is a polarized poly(vinylidene fluoride) in which the polarization is essentially stable to about the crystal melting range of its polar crystals.

6. A polarized material of claim 1 wherein the material is a polarized vinylidene copolymer which is capable of said polarization stability.

7. A polarized material of claim 1 wherein the material is a polarized poly(vinylidene fluoride/vinyl trifluoride) copolymer which is capable of said polarization stability.

8. A polarized material of claim 1 wherein the material is a polarized Nylon 11.

9. A polarized material of claim 1 wherein the material is a polarized Nylon 7.

10. A polarized material of claim 1 in which the material which is polarized is a soluble ceramic material.

11. A polarized material of claim 1 in which the material which is polarized is a polymer having polymer units capable of being polarized, selected from the group consisting of vinyl units, vinylidene units, ethylene units, acrylate units, methacrylate units, nylon units, carbonate units, acrylonitrile units, cellulose units, units having fluoro, chloro, amide, ester, cyanide, carbonate, nitrile or ether groups, protein units or combinations thereof.

12. A polarized material provided by a process for preparing a polarized material which process comprises the following steps:
1) forming a solution of a material capable of being polarized using a polarization solvent which can be removed by evaporation to provide a crystalline or amorphous polarized material which is free or substantially free of mechanically-induced orientation and has mechanical and electromechanical properties isotropic in a plane perpendicular to the poling field direction;
2) forming said solution into a desired shape which is adapted to poling; and
3) subjecting the shaped solution to poling using a poling temperature and an effective DC electric field having an intensity less than the level at which substantial dielectric breakdown of the material occurs, until substantial polarization is attained.

13. A polarized material provided by a process for preparing a polarized material which process comprises the following steps:
1) forming a solution of a material capable of being polarized using a polarization solvent which can be removed by evaporation to provide a crystalline or amorphous polarized material which is free or substantially free of mechanically-induced orientation and has mechanical and electromechanical properties isotropic in a plane perpendicular to the poling field direction;
2) increasing the concentration of said material in said solution by removal of a portion of said solvent so that said solution has a sufficiently high viscosity to be formed and retained in a desired shape;
3) forming said solution having a portion of said solvent removed into a desired shape which is adapted to poling;
4) subjecting the shaped solution to poling, using a poling temperature and an effective DC electric field having an intensity less than the level at which substantial dielectric breakdown of the material occurs, until substantial polarization is attained.

14. A polarized material of claim 12 in which the material used is a polarizable amorphous material.

15. A polarized material of claim 12 in which an amorphous material is used which has a glass transition temperature near or above which substantial degradation occurs.

16. A polarized material of claim 12 in which the amorphous material used has a glass transition temperature of at least about 200° C.

17. A polarized material of claim 12 in which the amorphous material used has a glass transition temperature in the range of about 200° C. to about 400° C.

18. A polarized material of claim 12 in which the amorphous material used is a poly(vinylidene cyanide/vinyl acetate) copolymer.

19. A polarized material of claim 12 in which the material used is poly(vinylidene fluoride).

20. A polarized material of claim 12 in which the material used is a vinylidene fluoride copolymer.

21. A polarized material of claim 12 in which the material used is poly(vinylidene fluoride/trifluoroethylene) copolymer.

22. A polarized material of claim 12 in which the material used is poly(vinylidene fluoride/tetrafluoroethylene) copolymer.

23. A polarized material of claim 12 wherein the dielectric constant is increased substantially by the presence therein of a dielectric constant improving solvent over the dielectric constant of said polarized material free of said solvent.

24. A polarized material of claim 23 wherein the dielectric constant is increased by at least 50 percent.

25. A polarized material of claim 1 wherein said material is a combination of two or more of the polarized materials as defined in claim 1.

26. A polarized material of claim 25 wherein one of said materials of said combination is poly(vinylidene fluoride).

27. A polarized material of claim 25 wherein one or more of said materials of said combination are selected from the group consisting of polarized Nylon 7, polarized Nylon 11 and combinations thereof.

28. A polarized material of claim 25 which comprises a dielectric constant improving solvent in an amount sufficient to afford a substantially higher dielectric constant as compared with the polarized material free of said solvent.

* * * * *